(12) United States Patent
Mayer et al.

(10) Patent No.: US 6,424,534 B1
(45) Date of Patent: Jul. 23, 2002

(54) COMPUTER ENCLOSURE RACK MOUNTING SYSTEM

(75) Inventors: David W. Mayer; Porter Rodgers Arbogast, both of Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/696,850

(22) Filed: Oct. 26, 2000

(51) Int. Cl.[7] ................................................ G06F 1/16
(52) U.S. Cl. ...................... 361/724; 361/727; 312/223.1
(58) Field of Search ................................. 361/679, 683, 361/724, 727; 312/223.1, 223.2, 223.3, 249.4, 249.11, 334.1, 334.7–334.9, 334.22–334.24, 334.28, 334.29, 334.31, 334.32, 334.34, 351.1

(56) References Cited

U.S. PATENT DOCUMENTS

| | | | |
|---|---|---|---|
| 5,571,256 A | * 11/1996 | Good et al. | 211/26 |
| 5,850,925 A | 12/1998 | Gandre | 211/26 |
| 6,021,047 A | 2/2000 | Lopez et al. | 361/727 |
| 6,142,590 A | * 11/2000 | Harwell | 312/223.1 |

* cited by examiner

Primary Examiner—Darren Schuberg
Assistant Examiner—Yean-Hsi Chang
(74) Attorney, Agent, or Firm—Kevin M. Hart

(57) ABSTRACT

A computer enclosure rack mounting system employs standoff members attached to left and right rails of telescoping extension slides. A computer enclosure includes bearing surfaces that are adapted to receive the standoff members. To install the computer enclosure into the rack, the left and right rails are extended, and the computer enclosure is lowered toward the rails until the standoff members of the rails engage the bearing members so as to support the enclosure. After this has been done, the enclosure and rails are simply slid back into the rack. The rails need not be removed from the rack to install the enclosure, and the enclosure need not be mounted to the rails by means of screws or bolts. The enclosure may be easily removed from the rack by reversing the just-described procedure, and may be installed into a different slot or a different rack without removing or replacing the rails.

17 Claims, 3 Drawing Sheets

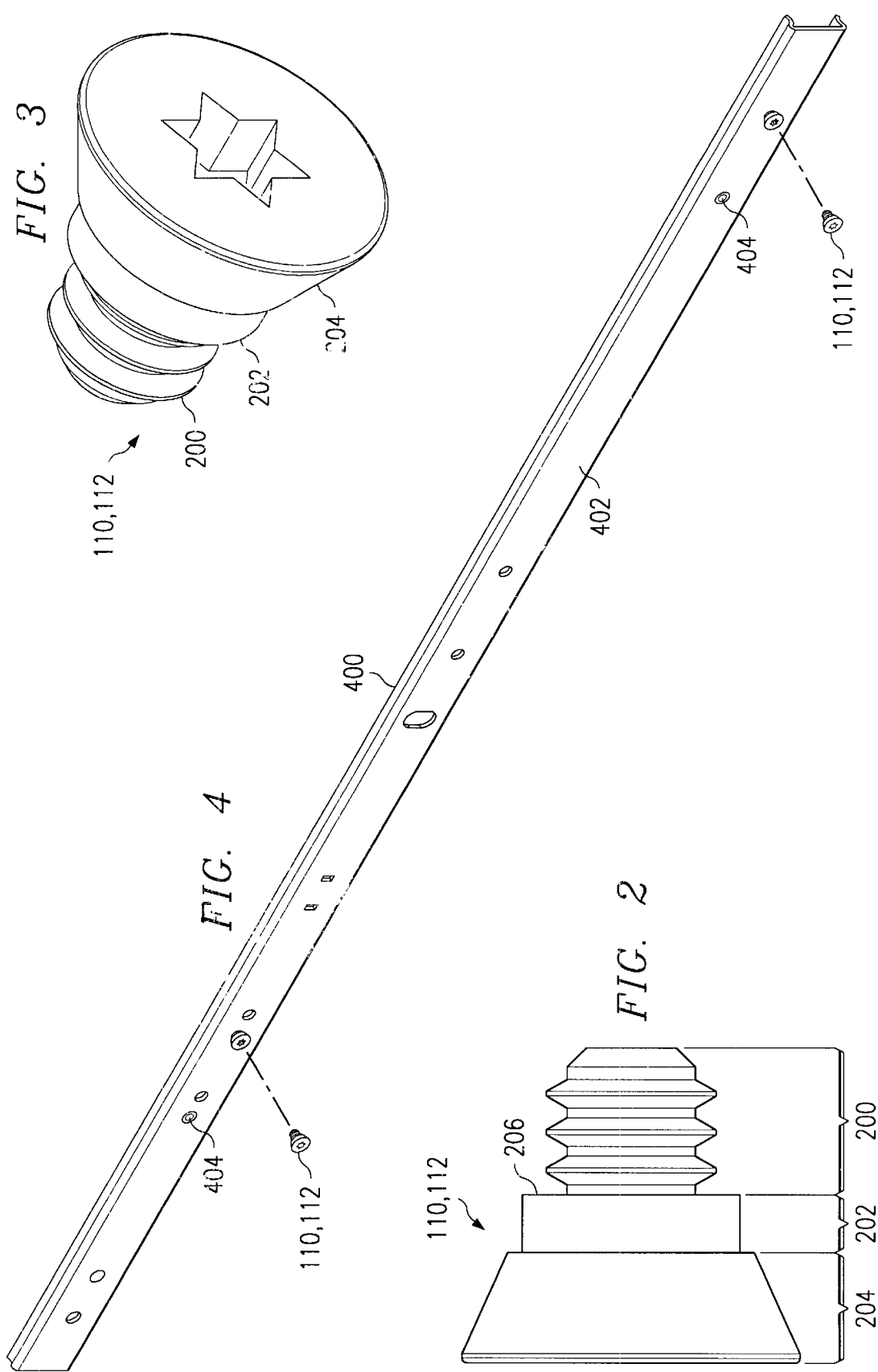

COMPUTER ENCLOSURE RACK MOUNTING SYSTEM

FIELD OF THE INVENTION

This invention relates to rack mounting techniques for computer enclosures.

BACKGROUND

In commercial settings, multiple computer enclosures are sometimes mounted in a vertical rack structure. This technique is referred to as "rack mounting," and is most frequently used with server-type computers that are accessed remotely via a network.

One common prior art rack mounting technique utilizes "quick disconnect" extension slides. In a quick disconnect extension slide installation, left and right telescoping slide assemblies are attached to the rack structure. A pair of removable inner slides is removed from the left and right assemblies. The removed slides are then attached to left and right sides, respectively, of a computer enclosure by means of bolts or screws. After this has been done, the inner slides must then be realigned with the telescoping slide assemblies on the rack and reinserted into them to complete the installation of the computer enclosure into the rack. While somewhat popular, this technique has several drawbacks associated with it:

First, it is ergonomically difficult to install a product into a rack using the quick disconnect slide technique. For heavier products, realignment of the removed slides with those on the rack becomes challenging after the computer enclosure has been attached to the removed slides. This is particularly true for installations into the higher slots of a tall rack. In addition, realignment of the removed slides requires the installer or installers to stand in front of the enclosure and rack. This can be problematic in the tight quarters of a computer room.

Second, quick disconnect slide assemblies are prone to bearing damage during the installation of a computer into the rack. Specifically, the bearings between the removable inner slides and the non-removable slide assemblies are not capable of rolling during reinsertion of the removed inner slides. This creates forces so great during reinsertion that entire two-meter rack assemblies have been known to roll backwards responsive to the insertion force.

Third, the inner and outer slides of a quick disconnect assembly frequently must be treated as matched sets because of the tight tolerances that are required to cause them to function properly. For this reason, some manufacturers sell the inner and outer slide sets as pre-measured pairs. Consequently, it is often not possible to move a computer enclosure from one slot to another, or from one rack to another rack, without first removing the original pair of inner slides from the enclosure and installing a different pair of inner slides to the enclosure.

Finally, after a product has been mounted to a pair of inner slides and before the slides are inserted into the rack, the slide/product assembly is sometimes awkward to handle. This presents unwanted possibilities for damage both to the product and to the slides.

A need therefore exists for a better technique for mounting computer enclosures into a rack.

SUMMARY OF THE INVENTION

A computer enclosure rack mounting system according to the invention employs standoff members attached to left and right rails of telescoping extension slides. A computer enclosure adapted to be used with the inventive rack mounting system includes bearing surfaces that are adapted to receive the standoff members. To install the computer enclosure into the rack, the left and right rails are extended, and the computer enclosure is lowered toward the rails until the standoff members of the rails engage the bearing surfaces of the enclosure so as to support the enclosure. After this has been done, the enclosure and rails are simply slid back into the rack. The rails need not be removed from the rack to install the enclosure, and the enclosure need not be mounted to the rails by means of screws or bolts. The enclosure may be easily removed from the rack by reversing the just-described procedure, and may be installed into a different slot or a different rack without removing or replacing the rails.

BRIEF DESCRIPTION OF THE DRAWINGS

FIG. 2 is an oblique view of one of the standoff members of the system of FIG. 1.

FIG. 3 is a side view of the standoff member of FIG. 2.

FIG. 4 is an oblique view of an extendable slide member of the system of FIG. 1 illustrating a preferred mounting arrangement for the standoff members thereon.

DETAILED DESCRIPTION OF THE PREFERRED EMBODIMENTS

Figure 1:
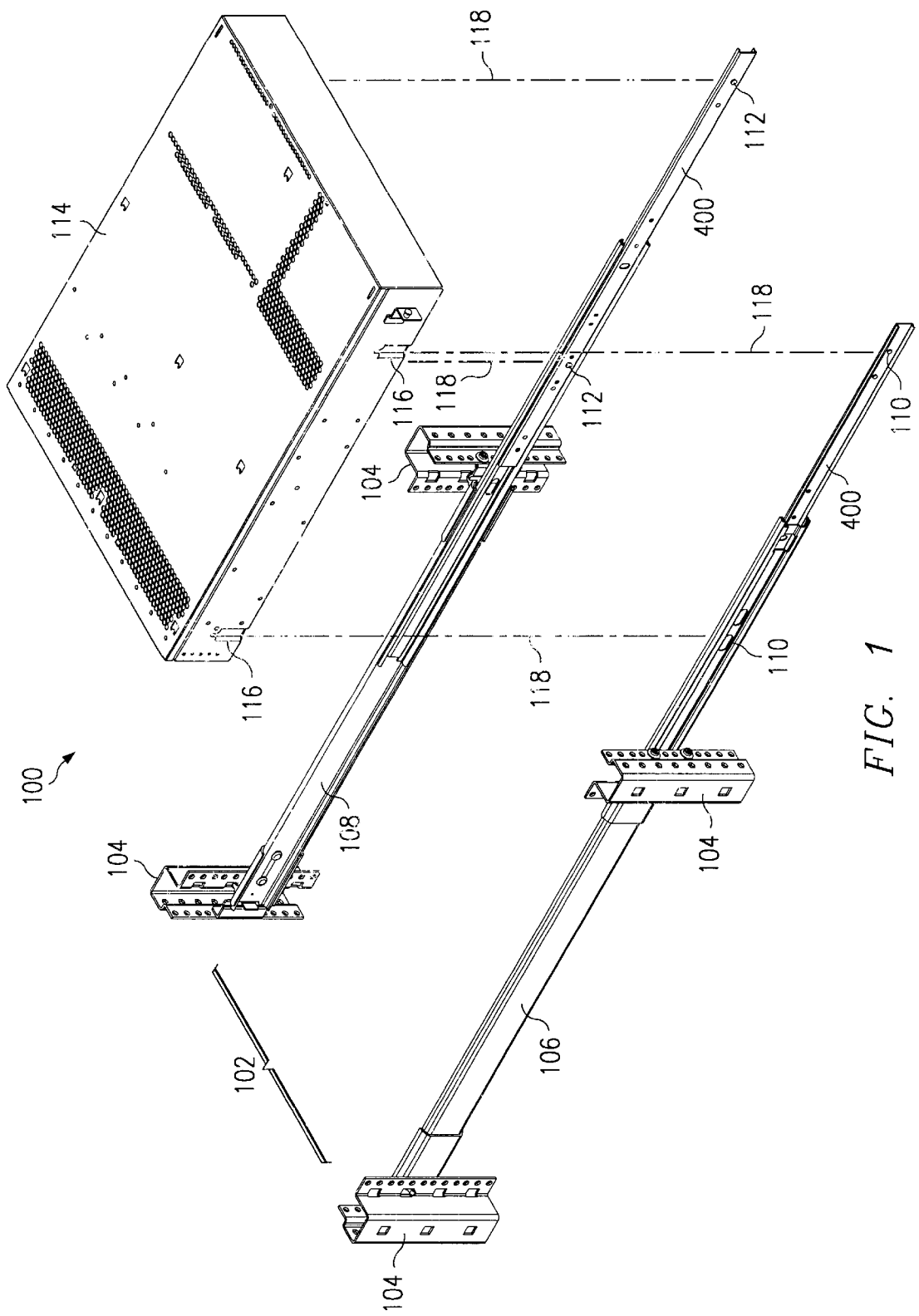
FIG. 1 is an oblique view of a computer enclosure and rack mounting system according to a preferred embodiment of the invention.

FIG. 1 illustrates a rack mounting system 100 according to a preferred embodiment of the invention. In the drawing, a single slot 102 of a multi-slot rack 104 is shown. A left extendable rail assembly 106 and a right extendable rail assembly 108 are mounted to rack 104 on the left and right sides, respectively, of slot 102. Two left standoff members 110 protrude from left rail assembly 106. Two right standoff members 112 protrude from right rail assembly 108. Computer enclosure 114 includes left recesses 116 and right recesses 500. (Right recesses 500 are identical to left recesses 116. They are not visible in FIG. 1, but are partially visible in FIG. 5.) Recesses 116 and 500 are adapted to receive standoff members 110 and 112 when enclosure 114 is lowered toward rails 106 and 108 as indicated by arrows 118. When the recesses engage the standoff members, computer enclosure 114 is supported by rail assemblies 106 and 108.

Preferably, left and right standoff members 110, 112 protrude from rails 106, 108 toward the inside of slot 102. Standoff members 110, 112 are illustrated in more detail in FIGS. 2 and 3. Preferably, each standoff member 110, 112 includes a threaded portion 200, a shank portion 202, and a head portion 204 as shown. Threaded portion 200 is screwed into a corresponding threaded hole in an extending slide member 400 of rail assemblies 106, 108 as shown in FIG. 4. Once a standoff member has been so installed into slide member 400, the inner face 206 of shank portion 202 will rest against the inside surface 402 of slide member 400. In this manner, shank portion 202 and head portion 204 will both extend into slot 102. Preferably, head portion 204 is tapered toward shank portion 202 as shown. This feature allows standoff members 110, 112 to guide recesses 116, 500 as enclosure 114 is lowered. Once recesses 116, 500 are engaged with standoff members 110, 112, they will rest on shank portions 202.

In a preferred embodiment, one or more sets of threaded holes 404 may be provided in alternative locations along slide member 400 to accommodate variously-sized computer enclosures. In such an embodiment, threaded standoff members 110, 112 may easily be moved to the alternative locations by unscrewing them from one set of holes and screwing them into the alternative set of holes.

Figure 5:
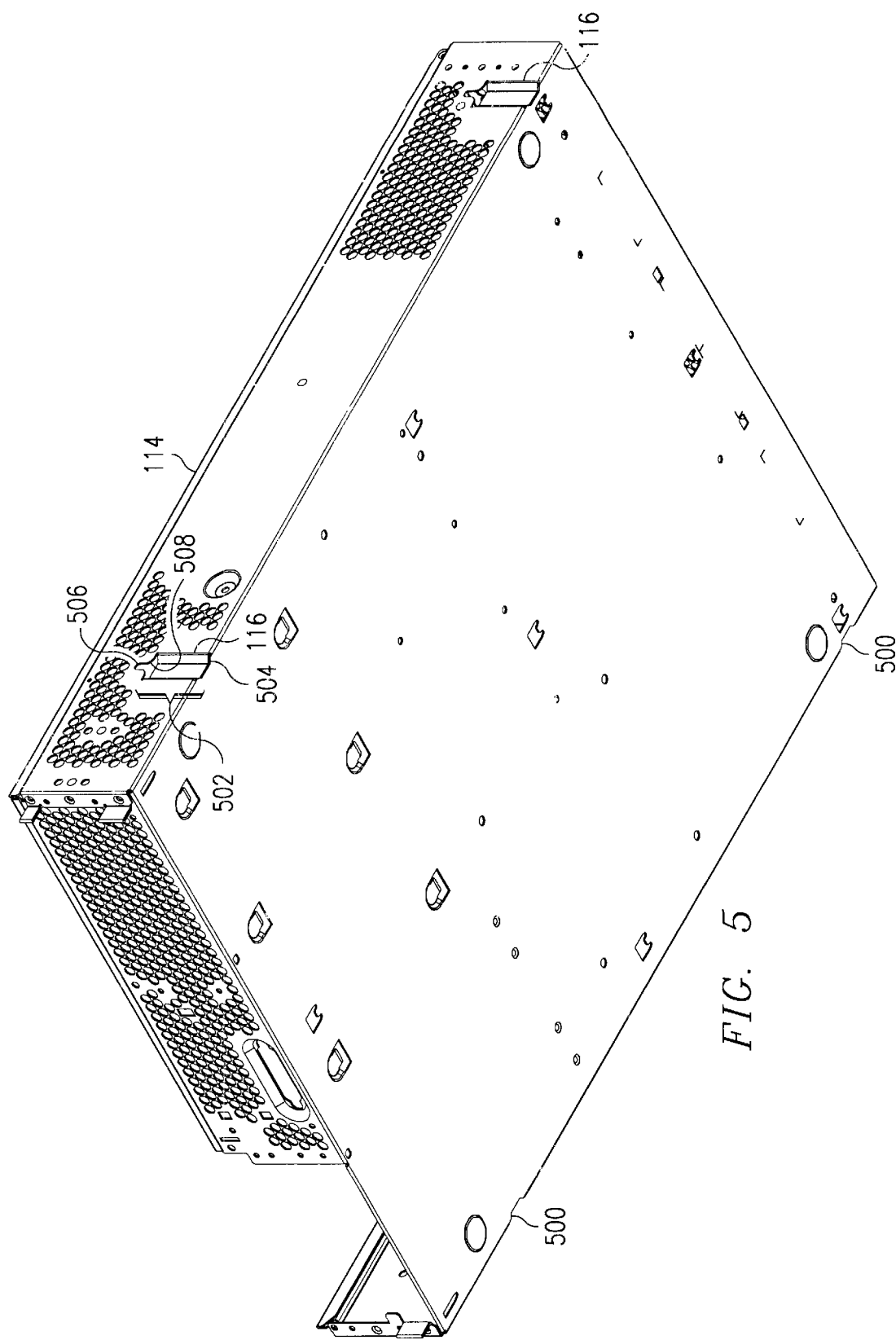
FIG. 5 is an oblique view of a computer enclosure adapted to receive standoff members according to a preferred embodiment of the invention.

Recesses 116, 500 are shown in more detail in FIG. 5. Each of the recesses includes a channel 502 having a first end 504 and a second end 506. The first end 504 is open and is substantially wider than the width of a standoff member so as to provide ample clearance for receiving the standoff member. The second end 506 is closed so as to provide a bearing surface for engaging the standoff member. The bearing surface rests against shank portion 202 of the standoff member when engaged. In a preferred embodiment, the width of end 506 is approximately equal to the diameter of shank portion 202 Oust large enough to receive the shank but no so large as to allow much lateral movement of the standoff member). Preferably, channel 502 includes a tapering region 508 between the first and second ends 504, 506 to facilitate alignment of the standoff member with end 506 while enclosure 114 is being lowered. In the embodiment shown, recesses 116, 500 are integrally formed in the material (typically sheet metal) of enclosure 114. In alternative embodiments, brackets may be mounted to enclosure 114 to provide bearing surfaces for engaging the standoff members.

To install enclosure 114 into rack 104, slide members 400 are extended forward. (Members 400 need not be removed from rack 104 as they were in prior art techniques.) Computer enclosure 114 is aligned over rails 106, 108 and members 400 so that recesses 116, 500 are above standoffs 110, 112. Enclosure 114 is then lowered onto rails 106, 108 so that the shank portions 202 of the standoff members engage the closed ends 506 of the recesses, thereby supporting enclosure 114 on rails 106, 108. Slide members 400 may then be retracted into slot 102 of rack 104, completing the installation. As was mentioned above, the standoff members may be screwed into alternative holes 404 prior to installation in order to accommodate differently-sized enclosures. The choice of which holes to be used may be driven by the locations of the corresponding recesses on the enclosure. To remove the enclosure from the rack, the just-described procedure is simply reversed.

While the invention has been described herein with reference to a particular embodiment, the illustrated embodiment has been shown by way of example and not by way of limitation. Persons having ordinary skill in the art and having reference to this specification will appreciate that various alternative embodiments may be created while remaining within the scope of the following claims and their equivalents.

What is claimed is:

1. A rack mounting system for computer enclosures, comprising:
    left and right extendable rails adapted to be mounted on the left and right sides, respectively, of a slot within a rack;
    left and right standoff members protruding from the left and right extendable rails, respectively; and
    a computer enclosure having left and right bearing surfaces adapted to receive the left and right standoff members such that the computer enclosure is supported by the left and right extendable rails when the bearing surfaces are engaged with the standoff members;
        wherein the left and right bearing surfaces comprise left and right recesses, respectively; and
        wherein each of the left and right recesses comprises a channel having a first end that is open for receiving a standoff member and having a second end that is closed for engaging the received standoff member and providing the bearing surface.

2. The rack mounting system of claim 1:
    wherein the first end of the channel is substantially wider than the width of a standoff member, so that easy clearance between the channel and the standoff member is achieved when the standoff member is disposed in the first end; and
    wherein the second end of he channel is approximately equal to the width of a standoff member, so that lateral retention of the standoff member is achieved when the standoff member is disposed in the second end.

3. The rack mounting system of claim 2:
    wherein the channel includes a tapering region between the first and second ends, the tapering region operable to guide the standoff member while the computer enclosure is being placed onto the extendable rails.

4. The rack mounting system of claim 1:
    wherein the left and right standoff members protrude inwardly toward the slot from the extendable rails.

5. The rack mounting system of claim 1:
    wherein each of the left and right bearing surfaces is integrally formed with the computer enclosure.

6. A rack mounting system for computer enclosures, comprising:
    left and right extendable rails adapted to be mounted on the left and right sides, respectively, of a slot within a rack;
    left and right standoff members protruding from the left and right extendable rails, respectively; and
    a computer enclosure having left and right bearing surfaces adapted to receive the left and right standoff members such that the computer enclosure is supported by the left and right extendable rails when the bearing surfaces are engaged with the standoff members;
        wherein each of the standoff members includes a threaded portion, a shank portion and a head portion, the head portion tapered toward the shank portion.

7. The rack mounting system of claim 6:
    wherein the left and right standoff members protrude inwardly toward the slot from the extendable rails.

8. The rack mounting system of claim 6:
    wherein each of the left and right bearing surfaces is integrally formed with the computer enclosure.

9. A rack mounting system for computer enclosures, comprising:
    left and right extendable rails adapted to be mounted on the left and right sides, respectively, of a slot within a rack;
    left and right standoff members protruding from the left and right extendable rails, respectively; and
    a computer enclosure having left and right bearing surfaces adapted to receive the left and right standoff members such that the computer enclosure is supported by the left and right extendable rails when the bearing surfaces are engaged with the standoff members;
        wherein each of the standoff members is attached to the extendable rails by means of threads; and wherein each of the extendable rails includes more than one set of threads adapted to receive the standoff members, whereby the standoff members maybe moved to accommodate computer enclosures that have recesses in alternative locations.

10. The rack mounting system of claim 9:

wherein the left and right standoff members protrude inwardly toward the slot from the extendable rails.

11. The rack mounting system of claim 9:

wherein each of the left and right bearing surfaces is integrally formed with the computer enclosure.

12. A method for mounting a computer enclosure into a rack, comprising the steps of:

extending left and right extendable rails mounted on the left and right sides, respectively, of a slot of the rack;

aligning the computer enclosure over the extended rails so that left and right bearing surfaces on the computer enclosure are adjacent to left and right standoff members extending from the rails;

lowering the computer enclosure toward the extended rails so that the left and right bearing surfaces engage the left and right standoff members, supporting the computer enclosure; and retracting the left and right extendable rails back into the rack.

13. The method of claim 12:

wherein the aligning step includes positioning first and second left recesses of the computer enclosure above first and second left standoff members, and positioning first and second right recesses over first and second right standoff members.

14. The method of claim 12, further comprising the step of:

screwing the left and right standoff members into the left and right extendable rails, respectively.

15. The method of claim 14, further comprising the step of:

choosing among a plurality of alternative positions provided on each of the left and right extendable rails wherein the left and right standoff members may be attached, the choice being driven by the positions of the left and right recesses on the computer enclosure.

16. The method of claim 12, wherein the lowering step includes:

passing each standoff member through a first end of a corresponding recess, the first end being substantially wider than the standoff member so that easy clearance is achieved; and causing each standoff member to move further into the corresponding recess toward a second end, the width of the second end being approximately equal to that of the standoff member so that the standoff member becomes engaged and further movement into the recess is prevented, whereby the computer enclosure is supported on the extendable rails by contact between the standoff member and the second end of the recess.

17. The method of claim 16, wherein the lowering step further comprises:

allowing a tapering region between the first and second ends of each recess to guide the alignment of the computer enclosure with the standoff members.

* * * * *